(12) United States Patent  (10) Patent No.: US 8,149,042 B2
Nakahara et al.  (45) Date of Patent: Apr. 3, 2012

(54) ANALOG SWITCH FOR SIGNAL SWINGING BETWEEN POSITIVE AND NEGATIVE VOLTAGES

(75) Inventors: Hironori Nakahara, Kyoto (JP); Sachito Horiuchi, Kyoto (JP)

(73) Assignee: Rohm Co., Ltd. (JP)

( * ) Notice: Subject to any disclaimer, the term of this patent is extended or adjusted under 35 U.S.C. 154(b) by 0 days.

(21) Appl. No.: 13/237,133

(22) Filed: Sep. 20, 2011

(65) Prior Publication Data

US 2012/0007636 A1  Jan. 12, 2012

Related U.S. Application Data

(62) Division of application No. 12/261,167, filed on Oct. 30, 2008.

(30) Foreign Application Priority Data

Oct. 30, 2007 (JP) .................................. 2007-282218
Oct. 30, 2007 (JP) .................................. 2007-282223

(51) Int. Cl.
  *H03L 5/00* (2006.01)
(52) U.S. Cl. ........................ 327/308; 327/434; 333/81 R
(58) Field of Classification Search .................. 327/308, 327/434; 333/81 R
  See application file for complete search history.

(56) References Cited

U.S. PATENT DOCUMENTS

| 4,672,241 A | 6/1987 | Venkatesh |
| 4,808,859 A | 2/1989 | Even-or et al. |
| 5,434,527 A | 7/1995 | Antone |
| 5,926,056 A * | 7/1999 | Morris et al. ............. 327/333 |
| 6,049,445 A * | 4/2000 | Gauthier et al. ............. 361/56 |
| 6,154,081 A | 11/2000 | Pakkala et al. |
| 6,268,759 B1 * | 7/2001 | Graves ........................ 327/437 |
| 6,642,578 B1 | 11/2003 | Arnold et al. |
| 6,703,889 B2 | 3/2004 | Dodson, III |
| 6,798,629 B1 * | 9/2004 | Proebsting ................... 361/56 |
| 7,026,858 B2 | 4/2006 | Tosaka |
| 7,098,755 B2 | 8/2006 | Zhao et al. |
| 7,138,846 B2 | 11/2006 | Suwa et al. |
| 7,145,758 B2 | 12/2006 | King et al. |
| 7,286,001 B2 | 10/2007 | Nakatsuka et al. |
| 7,459,988 B1 | 12/2008 | Iversen |
| 7,492,238 B2 | 2/2009 | Nakatsuka et al. |
| 7,786,787 B2 | 8/2010 | Brindle |
| 7,839,234 B2 | 11/2010 | Prikhodko et al. |

(Continued)

FOREIGN PATENT DOCUMENTS

JP  58-13027 A  1/1983

(Continued)

OTHER PUBLICATIONS

Final Office Action for U.S. Appl. No. 12/261,167 dated Jun. 20, 2011.

(Continued)

*Primary Examiner* — Kenneth B. Wells
(74) *Attorney, Agent, or Firm* — Cantor Colburn LLP

(57) ABSTRACT

An analog signal is input to an input terminal. An analog signal is output via an output terminal. A first transistor is an N-channel MOSFET, and is provided between the input terminal and the output terminal. A first resistor is provided between the gate of the first transistor and a first fixed voltage terminal (power supply terminal), which sets the gate of the first transistor to a high-impedance state.

1 Claim, 15 Drawing Sheets

10d

U.S. PATENT DOCUMENTS

RE41,982 E * 12/2010 McManus .................. 327/333

FOREIGN PATENT DOCUMENTS

| JP | 58-13028 A | 1/1983 |
|---|---|---|
| JP | 9-8625 A | 1/1997 |
| JP | 2006-157132 A | 6/2006 |

OTHER PUBLICATIONS

Final Office Action for U.S. Appl. No. 12/261,167 mailed Aug. 19, 2010.

Form 892 for U.S. Appl. No. 12/261,167 from Non-Final Office Action dated Mar. 25, 2010.

Form 892 from Non-Final Office Action for U.S. Appl. No. 12/261,167 dated Dec. 3, 2010.

Non-Final Office Action for U.S. Appl. No. 12/261,167 dated Mar. 25, 2010.

Non-Final Office Action for U.S. Appl. No. 12/261,167 dated Dec. 3, 2010.

Restriction Requirement for U.S. Appl. No. 12/261,167 dated Jan. 11, 2010.

* cited by examiner

10b

10c

10d

10g

10b

10c

10d

ANALOG SWITCH FOR SIGNAL SWINGING BETWEEN POSITIVE AND NEGATIVE VOLTAGES

The present application is a divisional application of U.S. patent application Ser. No. 12/261,167, filed on Oct. 30, 2008, the entire contents of which are incorporated herein by reference. The Ser. No. 12/261,167 application claimed the benefit of the date of the earlier filed Japanese Patent Application Nos. JP 2007-282218 filed Oct. 30, 2007, and JP 2007-282223 filed Oct. 30, 2007, the contents of which are incorporated by reference.

BACKGROUND OF THE INVENTION

1. Field of the Invention

The present invention relates to an analog switch.

2. Description of the Related Art

In order to disconnect a transmission path of an analog signal or in order to switch the transmission path, an analog switch is employed. In general, a transfer gate is often employed. The transfer gate includes an N-channel MOSFET (Metal Oxide Semiconductor Field Effect Transistor) and a P-channel MOSFET provided in parallel, such that both terminals thereof are connected to each other to form a common I/O terminal.

Patent Document 1

Japanese Patent Application Laid Open No. S58-13027

Patent Document 2

Japanese Patent Application Laid Open No. S58-13028

Patent Document 3

Japanese Patent Application Laid Open No. H9-8625

Patent Document 4

Japanese Patent Application Laid Open No. 2006-157132

Let us consider an arrangement in which an analog signal is transmitted via a transfer gate. In a state in which the transfer gate is in the ON state, the high-level voltage (power supply voltage) is applied to the gate of the N-channel MOSFET, and the low-level voltage (ground voltage or a negative power supply voltage) is applied to the gate of the P-channel MOSFET, thereby providing a fixed voltage state. In this state, when an analog input signal that changes according to the passage of time is input via the input terminal of the analog switch, the gate-source voltages of the MOSFETs change according to the change in the input signal.

The change in the gate-source voltages leads to a change in the ON resistances of the MOSFETs, leading to distortion in the waveform of the analog signal at the output terminal. In a case in which a signal which must be transmitted with low distortion, such as an analog audio signal, analog video signal, etc., is transmitted via such an analog switch, such an arrangement leads to a problem of poor sound quality or poor image quality.

SUMMARY OF THE INVENTION

The present invention has been made in view of the aforementioned problems. Accordingly, it is a general purpose of the present invention to provide an analog switch which is capable of signal transmission with reduced signal distortion.

1. An analog switch according to an embodiment of the present invention comprises: an input terminal via which an analog signal is input; an output terminal via which the analog signal is output; a first N-channel MOSFET (Metal Oxide Semiconductor Field Effect Transistor) provided between the input terminal and the output terminal; and a first resistor provided between the gate of the first MOSFET and a first fixed voltage terminal.

With such an embodiment, the first fixed voltage terminal and the gate of the first MOSFET are connected in a high-impedance state by means of the first resistor. In this state, when an analog signal is input via the input terminal, the input terminal and the gate are coupled by the gate-source capacitance (or the gate-drain capacitance), and accordingly, the gate voltage changes in phase with the input signal. As a result, such an arrangement suppresses fluctuation in the gate-source voltage of the first MOSFET. This suppresses fluctuation in the ON-resistance, thereby reducing distortion in the analog signal.

Also, the analog signal may be a signal that swings between a negative voltage and a positive voltage with the ground voltage as the midpoint. Also, in the ON state of the analog switch, the power supply voltage may be applied to the first fixed voltage terminal. That is to say, the first fixed voltage terminal may be a power supply terminal. This analog switch requires only the power supply voltage without involving a negative bias voltage, thereby providing a simple circuit configuration.

The analog switch according an embodiment may further include a second N-channel MOSFET which is connected in series with the first MOSFET between the input terminal and the output terminal, such that the gate thereof is connected to the gate of the first MOSFET so as to form a common gate.

The analog signal may be an audio signal. Furthermore, a bypass filter configured of the first resistor and the gate-source capacitance of the first MOSFET may allow a signal in the audio frequency band to pass through.

An analog switch according to an embodiment may further include a first capacitor provided between the input terminal and the gate of the first MOSFET.

With such an arrangement, the gate and the input terminal are coupled by the first capacitor, in addition to being coupled by the gate-source capacitance (gate-drain capacitance) of the MOSFET. This improves the response of the gate voltage to the input voltage, thereby further reducing distortion in the analog signal.

An analog switch according to an embodiment may further include a second capacitor provided between the output terminal and the gate of the first MOSFET.

With such an arrangement, the gate and the input terminal are coupled by the second capacitor, in addition to being coupled by the gate-source capacitance (gate-drain capacitance) of the MOSFET. This improves the response of the gate voltage to the input signal, thereby further reducing signal distortion.

Also, the analog switch according an embodiment may further include a third MOSFET provided between the first fixed voltage terminal and the first resistor, such that the gate voltage is controlled according to the ON/OFF operation of the analog switch.

Also, the analog switch according to an embodiment may further include a fourth MOSFET provided between the node that connects the first MOSFET and the second MOSFET and the first resistor, such that the gate voltage thereof is controlled according to the ON/OFF operation of the analog switch.

Also, the analog switch according to an embodiment may further include a fifth MOSFET provided between the node that connects the first MOSFET and the second MOSFET and the ground terminal, such that the gate voltage thereof is controlled according to the ON/OFF operation of the analog switch.

Also, the analog switch according to an embodiment may further include a first diode in series with the first resistor between the gate of the first MOSFET and the first fixed voltage terminal, such that the cathode thereof is arranged on the gate side of the first MOSFET.

Also, the analog switch according to an embodiment may further include: a sixth MOSFET which is a P-channel MOSFET provided between the input terminal and the output terminal; and a second resistor provided between the gate of the sixth MOSFET and the second fixed voltage terminal.

Also, the analog signal may be a signal that swings between a negative voltage and a positive voltage with the ground voltage as the midpoint. In the ON state of the analog switch, the ground voltage may be applied to the second fixed voltage terminal. That is to say, the second fixed voltage terminal may be the ground terminal. Alternatively, a negative voltage may be applied to the second fixed voltage terminal.

Also, the analog switch according to an embodiment may further include a seventh P-channel MOSFET which is connected in series with the sixth MOSFET between the input terminal and the output terminal, such that the gate thereof is connected to the gate of the sixth MOSFET so as to form a common gate.

Another embodiment of the present invention also relates to an analog switch. The analog switch comprises: an input terminal via which an analog signal is input; an output terminal via which the analog signal is output; a first MOSFET (Metal Oxide Semiconductor Field Effect Transistor) provided between the input terminal and the output terminal; and an impedance element which is provided between the gate of the first MOSFET and a first fixed voltage terminal, and which charges/discharges the gate of the first MOSFET according to the voltage of the analog signal.

Also, the analog signal may be an audio signal. Furthermore, an electroacoustic transducing device may be connected to the output terminal as a load. The "electroacoustic transducing device" represents a device which converts an electronic analog signal into an acoustic wave (sound), examples of which include speakers, headphones, earphones, etc. Such an electroacoustic transducing device has a small impedance of from several Ω to tens of Ω. Thus, the above-described analog switch, which is capable of suppressing fluctuation in the ON-resistance of the MOSFET, is suitably employed.

Yet another embodiment of the present invention relates to a selector circuit. The selector circuit includes the above-described multiple analog switches. The output terminals of the multiple analog switches are connected so as to form a common output terminal.

Such an embodiment offers a multiplexer which provides signal transmission with low distortion.

Yet another embodiment of the present invention also relates to a selector circuit. The selector circuit includes the above-described multiple analog switches. The input terminals of the multiple analog switches are connected so as to form a common input terminal.

Such an embodiment offers a demultiplexer which provides signal transmission with low distortion.

2. Yet another embodiment of the present invention also relates to an analog switch. The analog switch comprises: an input terminal via which an analog switch is input; an output terminal via which the analog signal is output; a first N-channel MOSFET (Metal Oxide Semiconductor Field Effect Transistor) provided between the input terminal and the output terminal; and a first diode provided between the gate of the first MOSFET and a first fixed voltage terminal, such that the cathode thereof is arranged on the gate side of the first MOSFET.

With such an embodiment, the first fixed voltage terminal and the gate of the first MOSFET are connected in a high-impedance state by means of the first diode. In this state, when an analog signal is supplied via the input terminal, the input terminal and the gate are coupled by the gate-source capacitance (or the gate-drain capacitance), thereby changing the gate voltage in phase with the input signal. As a result, such an arrangement suppresses fluctuation in the gate-source voltage of the first MOSFET. This suppresses fluctuation in the ON-resistance, thereby reducing distortion in the analog signal.

In the ON state of the analog switch, the power supply voltage may be applied to the first fixed voltage terminal. That is to say, the first fixed voltage terminal may be the power supply terminal. Such an analog switch requires only the power supply voltage without involving a negative bias voltage, thereby providing a simple circuit configuration.

An analog switch according to an embodiment may further include a second MOSFET which is an N-channel MOSFET connected in series with the first MOSFET between the input terminal and the output terminal, such that the gate thereof is connected to the gate of the first MOSFET so as to form a common gate.

An analog switch according to an embodiment may further include a first capacitor provided between the input terminal and the gate of the first MOSFET.

With such an arrangement, the gate and the input terminal are coupled by the first capacitor, in addition to being coupled by the gate-source capacitance (gate-drain capacitance) of the MOSFET. This improves the response of the gate voltage to the input voltage, thereby further reducing signal distortion.

Also, the analog switch according to an embodiment may further include a second capacitor between the output terminal and the gate of the first MOSFET.

With such an arrangement, the gate and the input terminal are coupled by the second capacitor, in addition to being coupled by the gate-source capacitance (gate-drain capacitance) of the MOSFET. This improves the response of the gate voltage to the input voltage, thereby further reducing signal distortion.

Also, the analog switch according to an embodiment may further include a third MOSFET provided between the first fixed voltage terminal and the anode of the first diode, such that the gate voltage is controlled according to the ON/OFF operation of the analog switch.

Also, the analog switch according to an embodiment may further include a fourth MOSFET provided between the node that connects the first MOSFET and the second MOSFET and the cathode of the first diode, such that the gate voltage thereof is controlled according to the ON/OFF operation of the analog switch.

Also, the analog switch according to an embodiment may further include a fifth MOSFET provided between the node that connects the first MOSFET and the second MOSFET and the ground terminal, such that the gate voltage thereof is controlled according to the ON/OFF operation of the analog switch.

Also, the analog switch according to an embodiment may further include a first resistor provided in series with the first diode between the gate of the first MOSFET and the first fixed voltage terminal.

Such an arrangement further includes the resistor, thereby allowing the impedance between the gate and the first fixed voltage terminal to be adjusted. Thus, the gain properties and the phase properties of the analog switch can be adjusted.

Also, the analog switch according to an embodiment may further include: a sixth MOSFET which is a P-channel MOSFET provided between the input terminal and the output terminal; and a second diode provided between the gate of the sixth MOSFET and a second fixed voltage terminal, such that the anode thereof is arranged on the gate side of the sixth MOSFET.

Yet another embodiment of the present invention also relates an analog switch. The analog switch comprises: an input terminal via which an analog signal is input; an output terminal via which the analog signal is output; a sixth MOSFET (Metal Oxide Semiconductor Field Effect Transistor) which is a P-channel MOSFET provided between the input terminal and the output terminal; and a second diode provided between the gate of the sixth MOSFET and a second fixed voltage terminal, in the direction in which the anode thereof is arranged on the gate side of the sixth MOSFET.

With such an embodiment, the second fixed voltage terminal and the gate of the second MOSFET are connected in a high-impedance state by means of the first diode. In this state, when an analog signal is supplied via the input terminal, the input terminal and the gate are coupled by the gate-source capacitance (or the gate-drain capacitance), thereby changing the gate voltage in phase with the input signal. As a result, such an arrangement suppresses fluctuation in the gate-source voltage of the first MOSFET. This suppresses fluctuation in the ON-resistance thereof, thereby reducing distortion in the analog signal.

In the ON state of the analog switch, the ground voltage may be applied to the second fixed voltage terminal. That is to say, the second fixed voltage terminal may be the ground terminal. Alternatively, the second fixed voltage terminal may be a negative voltage terminal.

Also, the analog switch according to an embodiment may further include a seventh P-channel MOSFET which is connected in series with the sixth MOSFET between the input terminal and the output terminal, such that the gate thereof is connected to the gate of the sixth MOSFET so as to form a common gate.

Yet another embodiment of the present invention also relates to an analog switch. The analog switch comprises: an input terminal via which an analog signal is input; an output terminal via which the analog signal is output; a first MOSFET (Metal Oxide Semiconductor Field Effect Transistor) provided between the input terminal and the output terminal; and an impedance element which is provided between the gate of the first MOSFET and a first fixed voltage terminal, and which charges/discharges the gate of the first MOSFET according to the voltage of the analog signal.

Also, the analog signal may be an audio signal. Furthermore, an electroacoustic transducing device may be connected to the output terminal as a load. The "electroacoustic transducing device" represents a device which converts an electronic analog signal into an acoustic wave (sound), examples of which include speakers, headphones, earphones, etc. Such an electroacoustic transducing device has a small impedance of from several Ω to tens of Ω. Thus, the above-described analog switch, which is capable suppressing fluctuation in the ON-resistance of the MOSFET, is suitably employed.

Yet another embodiment of the present invention relates to a selector circuit. The selector circuit includes the above-described multiple analog switches. The output terminals of the multiple analog switches are connected so as to form a common output terminal.

Such an embodiment offers a multiplexer which provides signal transmission with low distortion.

Yet another embodiment of the present invention also relates to a selector circuit. The selector circuit includes the above-described multiple analog switches. The input terminals of the multiple analog switches are connected so as to form a common input terminal.

Such an embodiment offers a demultiplexer which provides signal transmission with low distortion.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes: a state in which the member A and the member B are physically and directly connected to each other; and a state in which the member A and the member B are indirectly connected to each other via another member that does not affect the electric connection therebetween. In the same way, the state represented by the phrase "the member C is provided between the member A and the member B" includes a state in which these members are indirectly connected to each other via another member that does not affect the electric connection therebetween, in addition to the state in which the member A and the member C, or the member B and the member C are directly connected.

First Embodiment

Figure 1:
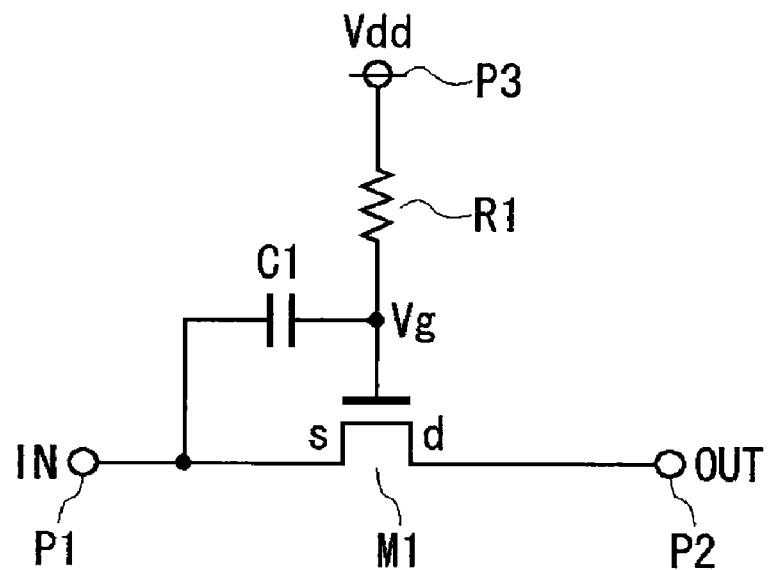
FIG. 1 is a circuit diagram which shows a principal part of the configuration of an analog switch according to a first embodiment.

FIG. 1 is a circuit diagram which shows a principal part of the configuration of an analog switch 10a according to a first embodiment. The analog switch 10a includes an input terminal P1, an output terminal P2, a first resistor R1, and a capacitor C1.

In the ON state, via the output terminal P2, the analog switch 10a outputs the input signal IN input via the input terminal P1. In the OFF state, the analog switch 10a sets the output terminal P2 to a state in which it is unrelated to the input signal IN, e.g., a high-impedance state or a state in which the output terminal P2 is fixed at a predetermined voltage.

The input signal IN is an analog signal which must be transmitted with low distortion, examples of which include an audio signal, a video signal, etc. Also, the input signal IN may be any one of other desired signals. Description will be made below regarding an arrangement in which the input signal IN has a waveform that swings between a positive voltage and a negative voltage with the ground voltage (0 V) as the midpoint.

A first transistor M1 is an N-channel MOSFET, and is provided between the input terminal P1 and the output terminal P2. For convenience of explanation, the terminal of the first transistor M1 on the input terminal P1 side will be referred to as the "source", and the terminal thereof on the output terminal P2 side will be referred to as the "drain".

The first resistor R1 is provided between the gate of the first transistor M1 and a first fixed voltage terminal P3.

When the analog switch 10a is in the ON state, the power supply voltage Vdd is applied to the first fixed voltage terminal P3. When the analog switch 10a is to be switched to the OFF state, the first transistor M1 should be switched to the OFF state. The switching method is not restricted in particular. For example, the ground voltage or a negative voltage may be applied to the first fixed voltage terminal P3. Alternatively, an arrangement may be made in which a switching element may be provided in series with the first resistor R1, and the bias voltage applied to the gate of the first transistor M1 is disconnected by turning off the switching element. FIG. 1 shows only a most basic configuration of the analog switch 10a, and does not show the configuration which allows the analog switch 10a to be switched between the ON state and the OFF state. In other words, FIG. 1 shows a circuit equivalent to the analog switch 10a in the ON state.

A first capacitor C1 is provided between the gate of the first transistor M1 and the input terminal P1. The first capacitor C1 may be provided in the form of a MIM (Metal Insulator Metal) capacitance. Also, the gate-source capacitance of the first transistor M1 may be used as the first capacitor C1. An arrangement in which the first capacitor C1 is formed in the form of a MIM capacitance has the advantage that the capacitance can be designed independent of the size of the first transistor M1. In a case in which the gate-source capacitance is used as the first capacitor C1, the transistor size is designed so as to provide a desired capacitance. The capacitance formed between the input terminal P1 and the gate of the first transistor M1 will be referred to as the "first capacitor C1" hereafter, regardless of whether it is provided in the form of a MIM capacitance or a parasitic capacitance.

In the same way, a second capacitor may be provided between the gate of the first transistor M1 and the output terminal P2. It should be noted that the second capacitor is provided in the form of the gate-drain capacitance of the first transistor M1, which is not shown in FIG. 1. Furthermore, a MIM capacitance may be provided, in addition to the gate-drain capacitance.

With regard to the analog switch 10a shown in FIG. 1, the first capacitor C1 and the first resistor R1 form a bypass filter between the input terminal P1 and the gate of the first transistor M1. The frequency band of the bypass filter should be designed such that it matches the frequency band of the analog signal IN. For example, in a case in which the analog signal IN is an audio signal, the bandpass filter is designed so as to allow an analog signal in the audio frequency band to pass through. As an example, the bypass filter is preferably designed with an R1 of around 100 MΩ, and a C1 of around 100 pF.

Figure 2:
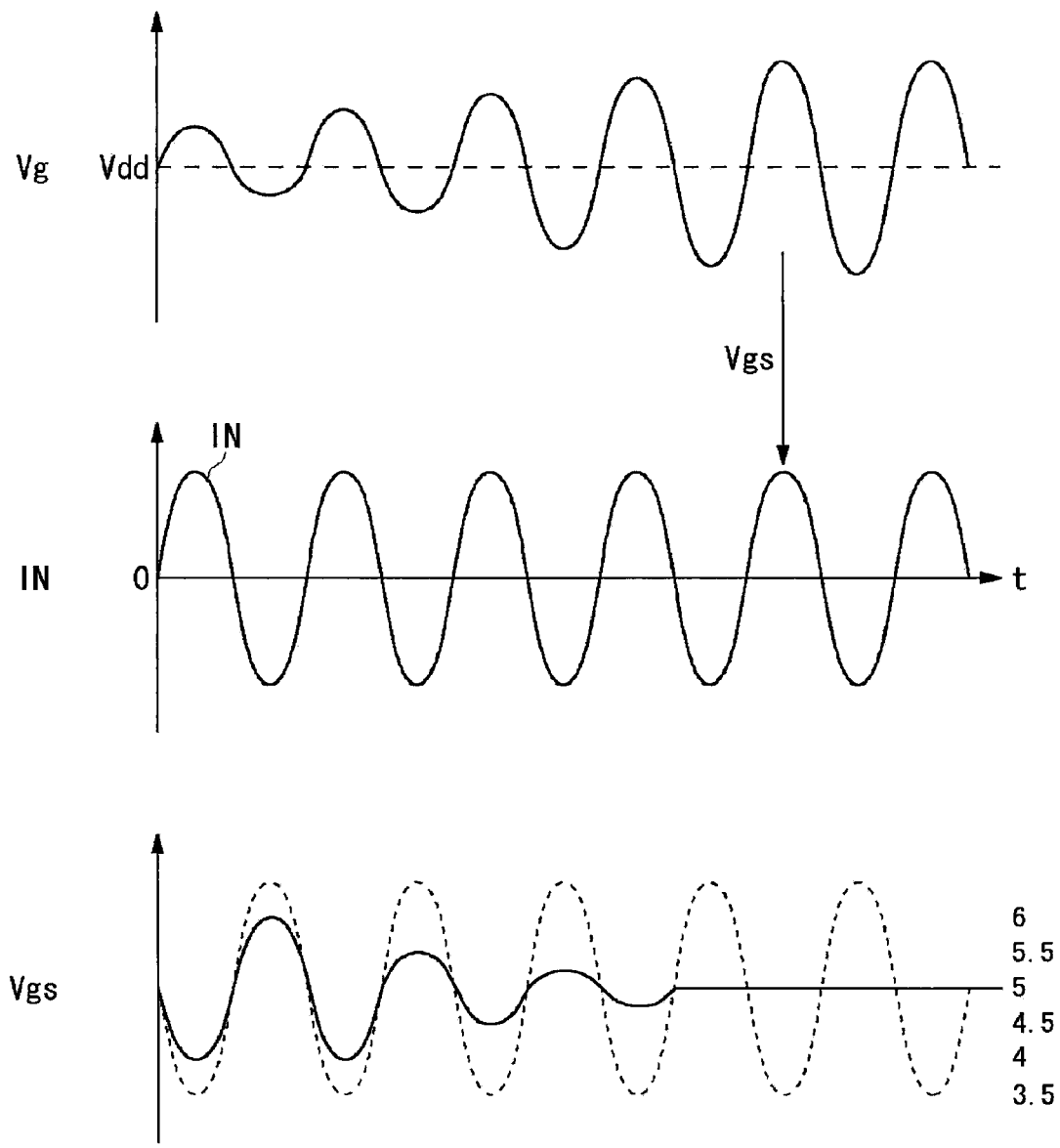
FIG. 2 is a time chart which shows the operation states of the analog switch shown in FIG. 1.

The above is a basic configuration of the analog switch 10a according to the embodiment. Next, description will be made regarding the operation of the analog switch 10a shown in FIG. 1. FIG. 2 is a time chart which shows the operation state of the analog switch 10a shown in FIG. 1. The vertical axis and the horizontal axis in FIG. 2 are expanded or reduced as appropriate in order to facilitate understanding. Furthermore, simple waveforms are shown in the drawing in order to facilitate understanding.

In order to clarify the effects of the circuit shown in FIG. 1, let us consider the operation of a circuit which does not include the first resistor R1. For example, in a case in which the first resistor R1 is not provided to the gate of the transistor, as in conventional transfer gates, the gate voltage Vg of the first transistor M1 is fixed to the power supply voltage Vdd, as indicated by the broken line shown in FIG. 2. Furthermore, the gate-source voltage Vgs of the first transistor M1 changes over time corresponding to the voltage value of the input signal IN, as indicated by the broken line shown in FIG. 2. As a result, the ON resistance of the first transistor M1 fluctuates, leading to fluctuation of the drain-source voltage of the first transistor M1. This leads to distortion in the output signal OUT with respect to the input signal IN.

On the other hand, the analog switch 10a shown in FIG. 1 operates as follows. The connection between the first fixed voltage terminal P3 and the gate of the first transistor M1 is made in a high-impedance manner by means of the first resistor R1. That is to say, the gate voltage Vg of the first transistor M1 is not fixed to the power supply voltage Vdd. The first resistor R1 provides a function as a device for charging the first transistor M1.

In this state, when the input signal IN is supplied to the input terminal P1 using the ground voltage (0 V) as the bias point as shown in FIG. 2, the gate voltage Vg changes in phase with the input signal IN, since the input terminal P1 and the gate are coupled by means of the first capacitor C1.

The voltage of the input signal IN corresponds to the source voltage of the first transistor M1. The source-gate voltage Vgs of the first transistor M1 is the potential difference between the gate voltage Vg of the first transistor M1 and the voltage of the input signal IN. As shown in FIG. 2, after the input signal IN is input, fluctuation of the gate-source voltage Vgs is reduced according to the passage of time, following which the gate-source voltage Vgs is stabilized to approximately a constant value. By stabilizing the gate-source voltage Vgs of the first transistor M1, fluctuation of the ON resistance Ron is suppressed. Thus, such an arrangement reduces distortion in the output signal OUT with respect to the input signal IN.

In particular, in a case in which a load with an impedance of from several Ω to tens of Ω, such as a speaker, headphones, or the like, is connected to the output terminal P2, noticeable distortion occurs in the output signal OUT due to the fluctuation of the ON resistance of the first transistor M1. Accordingly, the analog switch 10 shown in FIG. 1 and modifications described later can be suitably employed in an audio system.

In general, with conventional transfer gates, in order to transmit the input signal IN that swings between a negative voltage and a positive voltage using the voltage of 0 V as the bias point, the gate voltage for the P-channel MOSFET is biased to the negative power supply voltage (−Vdd). On the other hand, the circuit shown in FIG. 1 uses only the power supply voltage Vdd without involving the negative power supply, thereby providing a simple circuit configuration.

Description will be made regarding several modifications configured based upon the configuration shown in FIG. 1.

Figure 3:
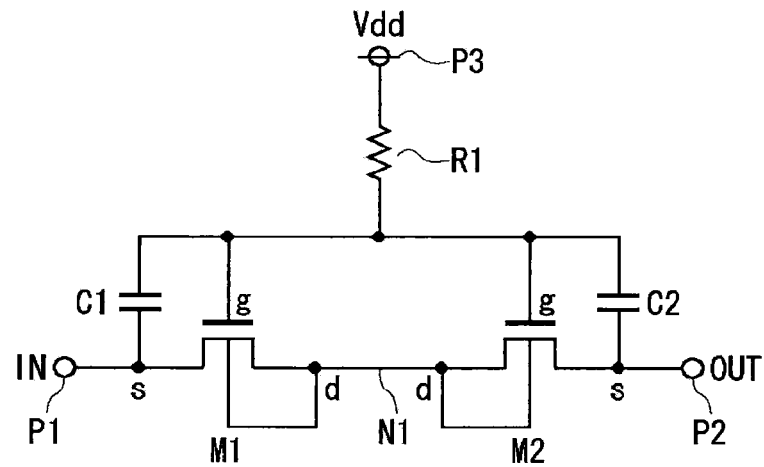
FIG. 3 is a circuit diagram which shows a configuration of an analog switch according to a first modification of the first embodiment.

FIG. 3 is a circuit diagram which shows an analog switch 10b according to a first modification. The analog switch 10b shown in FIG. 3 further includes a second transistor M2 and a second capacitor C2, in addition to the configuration of the analog switch 10a shown in FIG. 1.

The second transistor M2 is an N-channel MOSFET, which is the same type as the first transistor M1. The second transistor M2 and the first transistor M1 are connected in series between the input terminal P1 and the output terminal P2. Furthermore, the gate of the second transistor M2 and the gate of the first transistor M1 are connected to each other so as to form a common gate. For convenience of explanation, the terminal of the second transistor M2 on the output terminal P2 side will be referred to as the "source", and the terminal thereof on the first transistor M1 side will be referred to as the "drain".

The back gate of the first transistor M1 is preferably connected to a point on the node N1 side between the first transistor M1 and the second transistor M2, i.e., a point on the drain side of the first transistor M1. The back gate of the second transistor M2 is preferably connected to a point on the node N1 side, i.e., a point on the drain side of the second transistor M2.

The second capacitor C2 is provided between the gate of the second transistor M2 and the output terminal P2. The second capacitor C2 may be provided in the form of a MIM (Metal Insulator Metal) capacitance. Also, the gate-source capacitance of the second transistor M2 may be used as the second capacitor C2. The capacitance formed between the output terminal P2 and the gate of the second transistor M2 will be referred to as the "second capacitor C2" hereafter, regardless of whether it is provided in the form of a MIM capacitance or a parasitic capacitance.

With the modification shown in FIG. 3, the body diode (not shown) of the first transistor M1 and the body diode (not shown) of the second transistor M2 are connected in opposing directions between the input terminal P1 and the output terminal P2. As a result, in the OFF state of the analog switch 10b, such an arrangement provides improved isolation between the input terminal P1 and the output terminal P2.

Figure 4:
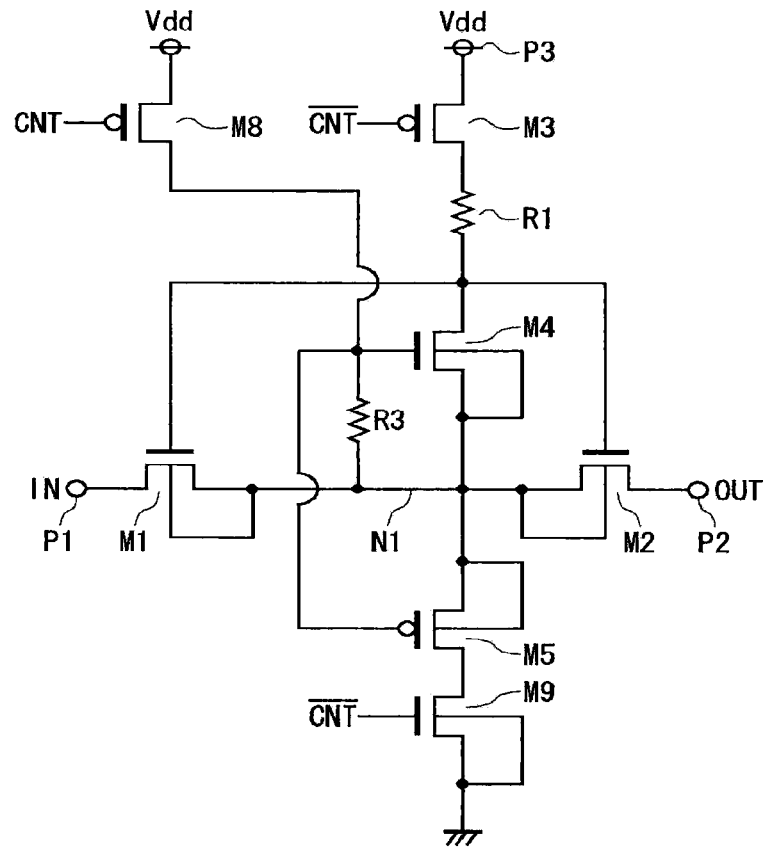
FIG. 4 is a circuit diagram which shows a configuration of an analog switch according to a second modification of the first embodiment.

FIG. 4 is a circuit diagram which shows the configuration of an analog switch 10c according to a second modification. The analog switch 10c shown in FIG. 4 includes a third transistor M3, a fourth transistor M4, a fifth transistor M5, an eighth transistor M8, and a ninth transistor M9, in addition to the configuration shown in FIG. 3. The transistors M3, M4, M5, M8, and M9 are provided in order to allow the analog switch 10c to be switched between the ON state and the OFF state. It should be noted that, in FIG. 4, the first capacitor C1 and the second capacitor C2 are not shown.

The third transistor M3 is provided between the first fixed voltage terminal P3 and the first resistor R1. The gate voltage thereof is controlled according to the ON/OFF operation of the analog switch 10c. That is to say, a control signal #CNT (in this specification, the symbol "#" indicates "logical inversion"), which is switched to the low-level state when the analog switch 10c is switched to the ON state, is input to the gate of the third transistor M3.

The fourth transistor M4 is provided between the node N1 that connects the first transistor M1 and the second transistor M2 and the first resistor R1. The gate voltage of the fourth transistor M4 is controlled according to the ON/OFF operation of the analog switch 10c. A resistor R3 is provided between the gate of the fourth transistor M4 and the node N1. Furthermore, the eighth transistor M8 is provided between the power supply terminal and the gate of the fourth transistor M4. With such an arrangement, a control signal CNT is supplied to the gate of the eighth transistor M8. When the control signal CNT is switched to the high-level state, the eighth transistor M8 is switched to the OFF state. In this state, the gate of the fourth transistor M4 is pulled down by the resistor R3, and accordingly, the fourth transistor M4 is switched to the OFF state. When the control signal CNT is switched to the low-level state, the eighth transistor M8 is switched to the ON state. In this state, the gate of the fourth transistor M4 is switched to the high-level state, and accordingly, the fourth transistor M4 is switched to the ON state.

The fifth transistor M5 and the ninth transistor M9 are provided in series between the node N1 that connects the first transistor M1 and the second transistor M2 and the ground terminal. The gate voltages of the fifth transistor M5 and the ninth transistor M9 are controlled according to the control signal CNT. The gate of the fifth transistor M5 and the gate of the fourth transistor M4 are connected to each other so as to form a common gate. When the control signal CNT is switched to the high-level state, and the eighth transistor M8 is accordingly switched to the OFF state, the gate of the fifth transistor M5 is pulled up by means of the resistor R3, thereby switching the fifth transistor M5 to the OFF state. Furthermore, the control signal #CNT is input to the gate of the ninth transistor M9.

With the analog switch 10c shown in FIG. 4, when the control signal CNT is in the high-level state, the fourth transistor M4, the fifth transistor M5, and the ninth transistor M9 are in the OFF state, and the third transistor M3 is in the ON state, thereby providing a state equivalent to the state of the analog switch 10b shown in FIG. 3. In this state, the input signal IN input via the input terminal P1 is output via the output terminal P2.

When the control signal CNT is switched to the low-level state, the fifth transistor M5 and the ninth transistor M9 are switched to the ON state, and the node N1 is grounded. Furthermore, the fourth transistor M4 is switched to the ON state, and accordingly, the gates of the first transistor M1 and the second transistor M2 are grounded. As a result, at least one of the first transistor M1 and the second transistor M2 is switched to the OFF state, thereby disconnecting the connection between the input terminal P1 and the output terminal P2. Furthermore, the third transistor M3 is switched to the OFF state, thereby preventing unnecessary current flow from the first fixed voltage terminal P3 to the ground.

Such an arrangement including the fifth transistor M5, the ninth transistor M9, the fourth transistor M4, the third transistor M3, and the eighth transistor M8 has the above-described advantage. Also, several transistors may be selectively employed.

Figure 5:
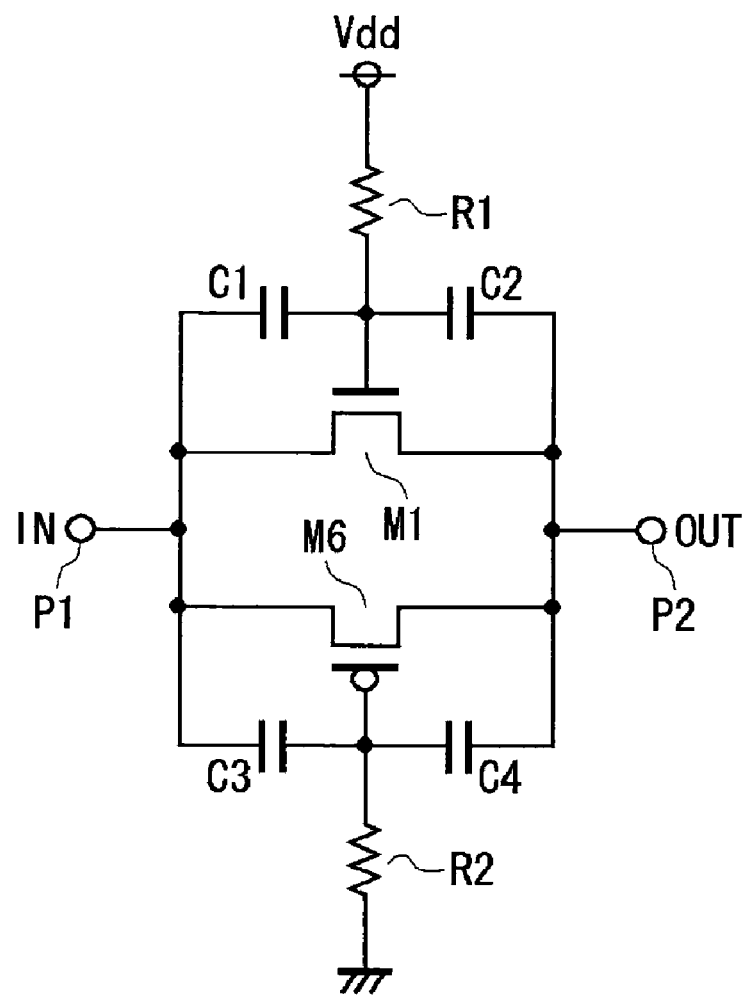
FIG. 5 is a circuit diagram which shows a configuration of an analog switch according to a third modification of the first embodiment.

FIG. 5 is a circuit diagram which shows a configuration of an analog switch 10d according to a third modification. The analog switch 10d shown in FIG. 5 further includes a sixth transistor M6, a second resistor R2, a third capacitor C3, and a fourth capacitor C4, in addition to the configuration of the analog switch 10a shown in FIG. 1.

The sixth transistor M6 is a P-channel MOSFET, and is provided between the input terminal P1 and the output terminal P2. The second resistor R2 is provided between the gate of the sixth transistor M6 and the second fixed voltage terminal P4. In the ON state of the analog switch 10d, the ground voltage is preferably applied to the second fixed voltage terminal P4.

The third capacitor C3 is provided between the gate of the second transistor M2 and the input terminal P1. The fourth capacitor C4 is provided between the gate of the second transistor M2 and the output terminal P2. The third capacitor C3 and the fourth capacitor C4 may be provided in the form of a MIM capacitance or a parasitic capacitance of the sixth transistor M6 (gate-source capacitance or gate-drain capacitance).

With the circuit shown in FIG. 5, the gate of the sixth transistor M6 is grounded via the second resistor R2, thereby providing a high-impedance state. The first terminal P1 and the gate of the sixth transistor M6 are coupled by means of the third capacitor C3. Accordingly, the gate voltage of the sixth transistor M6 swings in phase with the input signal IN. As a result, the gate-source voltage of the sixth transistor M6 is maintained at a constant voltage. This suppresses fluctuation in the ON-resistance of the sixth transistor M6, thereby reducing distortion in the signal.

With the analog switch 10d shown in FIG. 5, the synthetic impedance formed between the input terminal P1 and the output terminal P2 is smaller than that shown in FIG. 1, thereby reducing signal decay (or loss).

Figure 6B:
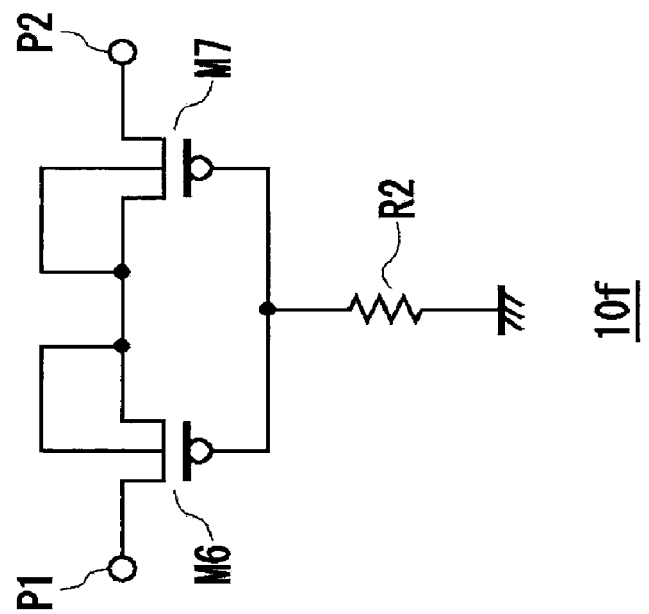
FIGS. 6A and 6B are circuit diagrams which show the configurations of analog switches according to a fourth modification of the first embodiment.
Figure 6A:
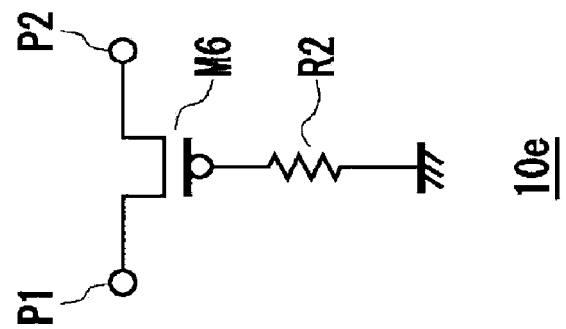

FIG. 6A and FIG. 6B are circuit diagrams which show the configurations of analog switches 10e and 10f according to a fourth modification. FIG. 6A shows a modification of the circuit shown in FIG. 5, in which the fifth transistor M5, the first resistor R1, the first capacitor C1, and the second capacitor C2 are omitted. Viewed from a different perspective, the analog switch 10e shown in FIG. 6A has a circuit configuration in which the first transistor M1 of the analog switch 10a shown in FIG. 1 is replaced by a P-channel MOSFET.

The analog switch 10f shown in FIG. 6B includes a seventh transistor M7, in addition to the configuration shown in FIG. 6A. The seventh transistor M7 is a P-channel MOSFET, and is connected in series with the sixth transistor M6 between the input terminal P1 and the output terminal P2. The gate of the seventh transistor M7 and the gate of the sixth transistor M6 are connected to each other so as to form a common gate. That is to say, it can be understood that the analog switches 10e and 10f shown in FIG. 6A and FIG. 6B have the same circuit configurations as those of the analog switches 10a and 10b shown in FIG. 1 and FIG. 3, respectively, except that the N-channel MOSFETs are replaced by the P-channel MOSFETs, and the diodes are provided in opposing directions. Accordingly, the modification described with reference to FIG. 4 can also be applied to the circuits shown in FIGS. 6A and 6B.

Figure 7:
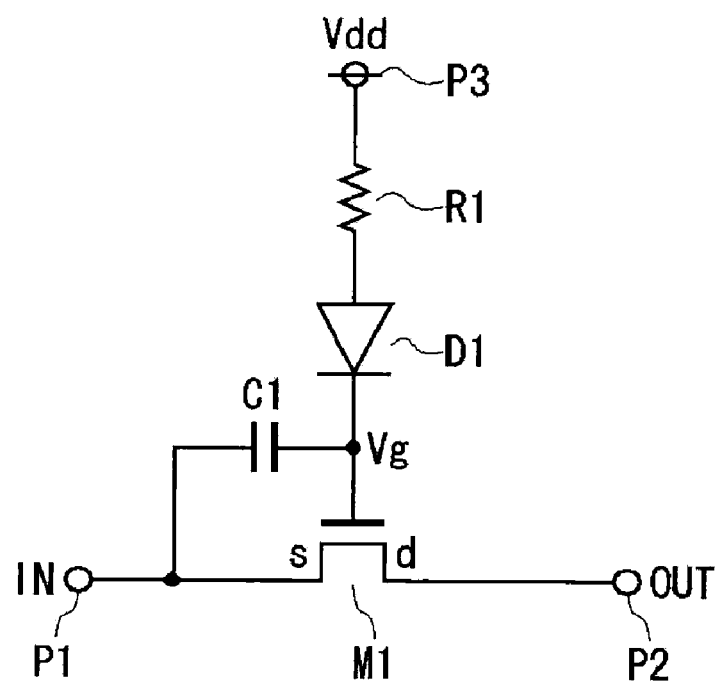
FIG. 7 is a circuit diagram which shows a configuration of an analog switch according to a fifth modification of the first embodiment.

FIG. 7 is a circuit diagram which shows a configuration of an analog switch 10g according to a fifth modification. The analog switch 10g shown in FIG. 7 further includes a first diode D1 provided in series with the first resistor R1 between the gate of the first transistor M1 and the first fixed voltage terminal P3. The first diode D1 is arranged such that the cathode is arranged on the gate side of the first transistor M1. The positions of the resistor R1 and the first diode D1 may be exchanged. Also, a second diode may be provided in series with the second resistor R2 shown in FIG. 5 and FIGS. 6A and 6B. The second diode is arranged such that the anode thereof is arranged on the gate side of the P-channel MOSFET.

Viewed from a different perspective, the above-described analog switches can be understood as follows. That is to say, an analog switch according to an embodiment includes: an input terminal P1 via which an analog signal IN is input; an output terminal P2 via which an analog signal OUT is output; a MOSFET which is provided between the input terminal P1 and the output terminal P2; and an impedance element which is provided between the gate of the MOSFET and the fixed voltage terminal, and which charges the gate of the MOSFET. The term "impedance element" represents a circuit device element having impedance which allows the gate voltage of the MOSFET to change without being fixed to the voltage at the fixed voltage terminal. With the embodiment, the impedance element is provided in the form of a diode or a combination of a diode and a resistor.

Figure 8B:
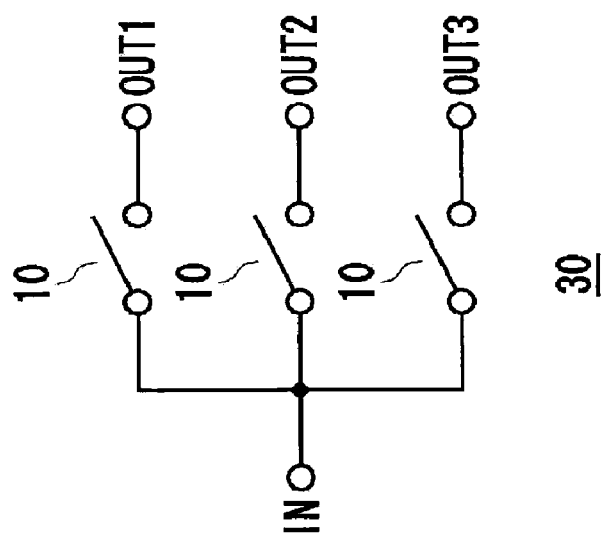
FIGS. 8A and 8B are block diagrams which show the configurations of selector circuits using the analog switches.
Figure 8A:
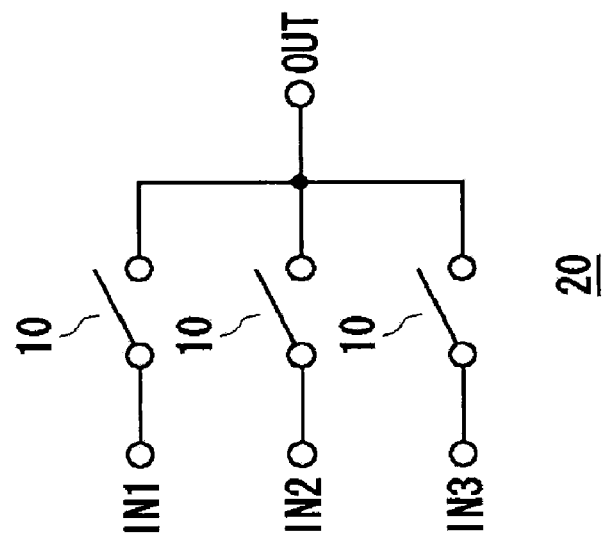

FIGS. 8A and 8B are block diagrams which show the configurations of selector circuits employing any one of the above-described analog switches 10 through 10g (which will be simply referred to as the "analog switch 10"). FIG. 8A shows a multiplexer 20, and FIG. 8B shows a demultiplexer 30. The multiplexer shown in FIG. 8A includes multiple analog switches 10. Each analog switch may be any one of the above-described circuits. The output terminals of the multiple analog switches 10 are connected to each other so as to form a common output terminal. The input terminals receive respective signals that differ from one another. The demultiplexer 30 shown in FIG. 8B includes multiple analog switches 10. Each analog switch may be any one of the above-described circuits. The input terminals of the multiple analog switches 10 are connected to each other so as to form a common input terminal. The output terminals are connected to respective circuit blocks that differ from one another. Each of the multiplexer 20 and the demultiplexer 30 has the advantage of reducing distortion in the transmitted signal.

Description has been made in the embodiment regarding an arrangement in which an analog signal is transmitted via the analog switch 10. Also, a digital signal may be transmitted via the analog switch 10. Also, a differential signal may be transmitted using two paired analog switches.

Second Embodiment

Figure 9:
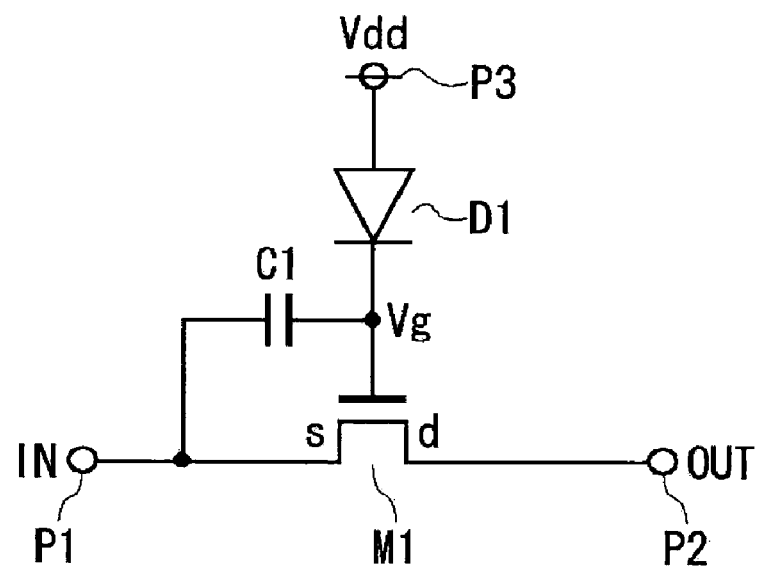
FIG. 9 is a circuit diagram which shows the principal part of the configuration of the analog switch according to a second embodiment.

FIG. 9 is a circuit diagram which shows a principal part of the configuration of an analog switch 10a according to a second embodiment. The analog switch 10a includes an input terminal P1, an output terminal P2, a first diode D1, and a capacitor C1.

In the ON state, via the output terminal P2, the analog switch 10a outputs the input signal IN input via the input terminal P1. In the OFF state, the analog switch 10a sets the output terminal P2 to a state in which it is unrelated to the input signal IN, e.g., a high-impedance state or a state in which the output terminal P2 is fixed at a predetermined voltage.

The input signal IN is an analog signal which must be transmitted with low distortion, examples of which include an audio signal, a video signal, etc. Also, the input signal IN may be any one of other desired signals. Description will be made below regarding an arrangement in which the input signal IN has a waveform that swings between a positive voltage and a negative voltage with the ground voltage (0 V) as the midpoint.

A first transistor M1 is an N-channel MOSFET, and is provided between the input terminal P1 and the output terminal P2. For convenience of explanation, the terminal of the first transistor M1 on the input terminal P1 side will be referred to as the "source", and the terminal thereof on the output terminal P2 side will be referred to as the "drain".

The first diode D1 is provided between the gate of the first transistor M1 and a first fixed voltage terminal P3. The first diode D1 is arranged such that the cathode thereof is arranged on the gate side of the first transistor M1, and the anode thereof is arranged on the first fixed voltage terminal P3 side.

When the analog switch 10a is in the ON state, the power supply voltage Vdd is applied to the first fixed voltage terminal P3. When the analog switch 10a is to be switched to the OFF state, the first transistor M1 should be switched to the OFF state. The switching method is not restricted in particular. For example, the ground voltage or a negative voltage may be applied to the first fixed voltage terminal P3. Alternatively, an arrangement may be made in which a switching element may be provided in series with the first diode D1, and the bias voltage applied to the gate of the first transistor M1 is disconnected by turning off the switching element. FIG. 9 shows only a most basic configuration of the analog switch 10a, and does not show the configuration which allows the analog switch 10a to be switched between the ON state and the OFF state. In other words, FIG. 9 shows a circuit equivalent to the analog switch 10a in the ON state.

A first capacitor C1 is provided between the gate of the first transistor M1 and the input terminal P1. The first capacitor C1 may be provided in the form of a MIM (Metal Insulator Metal) capacitance. Also, the gate-source capacitance of the first transistor M1 may be used as the first capacitor C1. An arrangement in which the first capacitor C1 is formed in the form of a MIM capacitance has the advantage that the capacitance can be designed independent of the size of the first transistor M1. In a case in which the gate-source capacitance is used as the first capacitor C1, the transistor size is designed so as to provide a desired capacitance. The capacitance formed between the input terminal P1 and the gate of the first transistor M1 will be referred to as the "first capacitor C1" hereafter, regardless of whether it is provided in the form of a MIM capacitance or a parasitic capacitance.

In the same way, a second capacitor may be provided between the gate of the first transistor M1 and the output terminal P2. It should be noted that the second capacitor is provided in the form of the gate-drain capacitance of the first transistor M1, which is not shown in FIG. 9. Furthermore, a MIM capacitance may be provided, in addition to the gate-drain capacitance.

Figure 10:
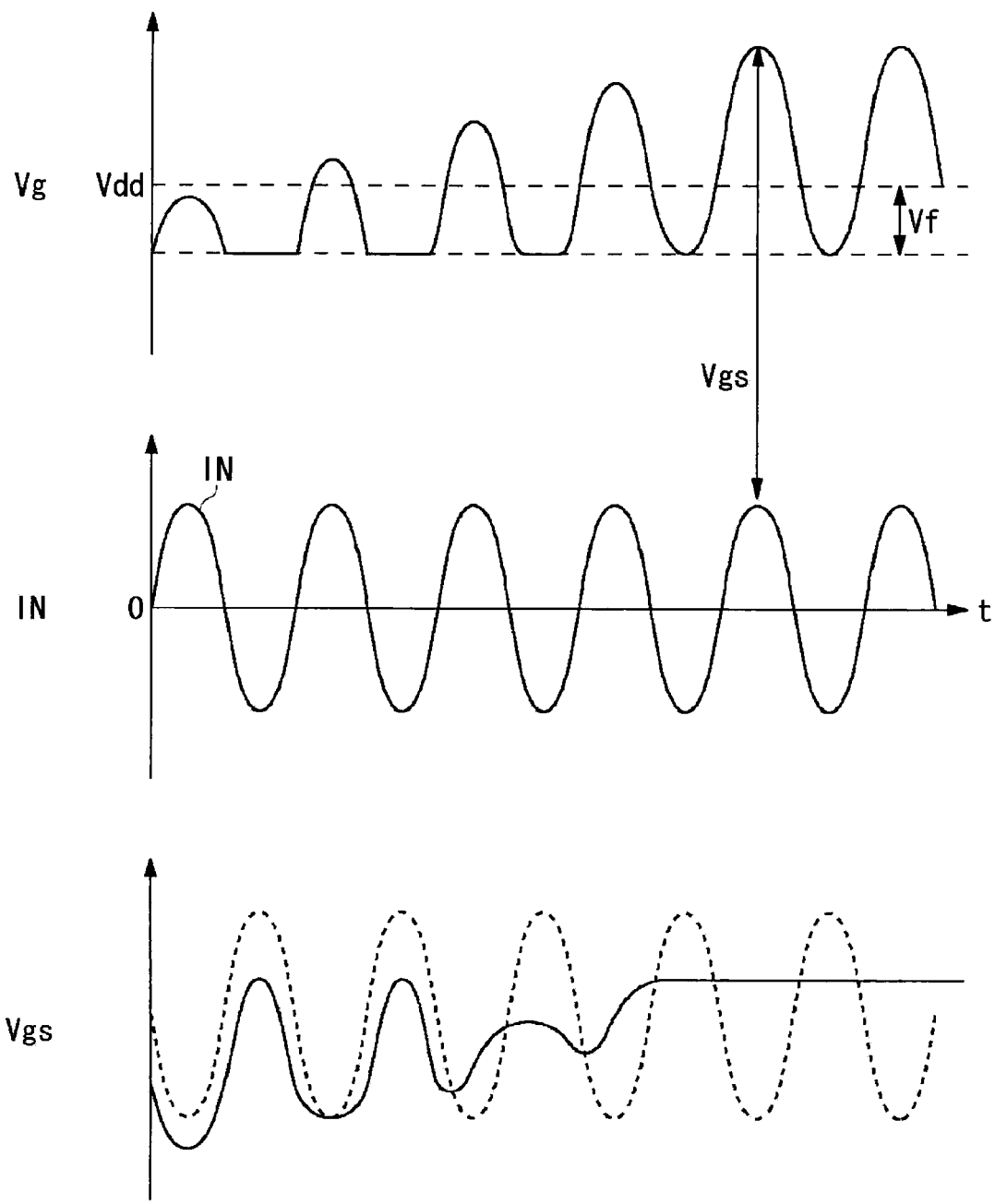
FIG. 10 is a time chart which shows the operation states of the analog switch shown in FIG. 9.

The above is a basic configuration of the analog switch 10a according to the embodiment. Next, description will be made regarding the operation of the analog switch 10a shown in FIG. 9. FIG. 10 is a time chart which shows the operation state of the analog switch 10a shown in FIG. 9. The vertical axis and the horizontal axis in FIG. 10 are expanded or reduced as appropriate in order to facilitate understanding. Furthermore, simple waveforms are shown in the drawing in order to facilitate understanding.

In order to clarify the effects of the circuit shown in FIG. 9, let us consider the operation of a circuit which does not include the first diode D1. For example, in a case in which the first diode D1 is not provided to the gate of the transistor, as in conventional transfer gates, the gate voltage Vg of the first transistor M1 is fixed to the power supply voltage Vdd, as indicated by the broken line shown in FIG. 10. Furthermore, the gate-source voltage Vgs of the first transistor M1 changes over time corresponding to the voltage value of the input signal IN, as indicated by the broken line shown in FIG. 10. As a result, the ON resistance of the first transistor M1 fluctuates, leading to fluctuation of the drain-source voltage of the first transistor M1. This leads to distortion in the output signal OUT with respect to the input signal IN.

On the other hand, the analog switch 10a shown in FIG. 9 operates as follows. The connection between the first fixed voltage terminal P3 and the gate of the first transistor M1 is made in a high-impedance manner by means of the first diode D1. That is to say, the gate voltage Vg of the first transistor M1 is not fixed to the power supply voltage Vdd. The first diode D1 provides a function as a device for charging the first transistor M1.

In this state, when the input signal IN is supplied to the input terminal P1 using the ground voltage (0 V) as the bias point as shown in FIG. 10, the gate voltage Vg changes in phase with the input signal IN, since the input terminal P1 and the gate are coupled by means of the first capacitor C1. As shown in FIG. 10, the gate voltage Vg is clamped at (Vdd−Vf) or more by means of the first diode D1.

The voltage of the input signal IN corresponds to the source voltage of the first transistor M1. The source-gate voltage Vgs of the first transistor M1 is the potential difference between the gate voltage Vg of the first transistor M1 and the voltage of the input signal IN. As shown in FIG. 10, after the input signal IN is input, fluctuation of the gate-source voltage Vgs is reduced according to the passage of time, following which the gate-source voltage Vgs is stabilized to approximately a constant value. By stabilizing the gate-source voltage Vgs of the first transistor M1, fluctuation of the ON resistance Ron is suppressed. Thus, such an arrangement reduces distortion in the output signal OUT with respect to the input signal IN.

In particular, in a case in which a load with an impedance of from several Ω to tens of Ω, such as a speaker, headphones, or the like, is connected to the output terminal P2, noticeable distortion occurs in the output signal OUT due to the fluctuation of the ON resistance of the first transistor M1. Accordingly, the analog switch 10 shown in FIG. 9 and modifications described later can be suitably employed in an audio system.

In general, with conventional transfer gates, in order to transmit the input signal IN that swings between a negative voltage and a positive voltage using the voltage of 0 V as the bias point, the gate voltage for the P-channel MOSFET is biased to the negative power supply voltage (−Vdd). On the other hand, the circuit shown in FIG. 9 uses only the power supply voltage Vdd without involving the negative power supply, thereby providing a simple circuit configuration.

With such an arrangement, the gate of the first transistor M1 is set to the high-impedance state by means of the first diode D. This reduces a phase delay as compared with an arrangement in which the high-impedance state is provided by means of a resistor.

Description will be made regarding several modifications configured based upon the configuration shown in FIG. 9.

Figure 11:
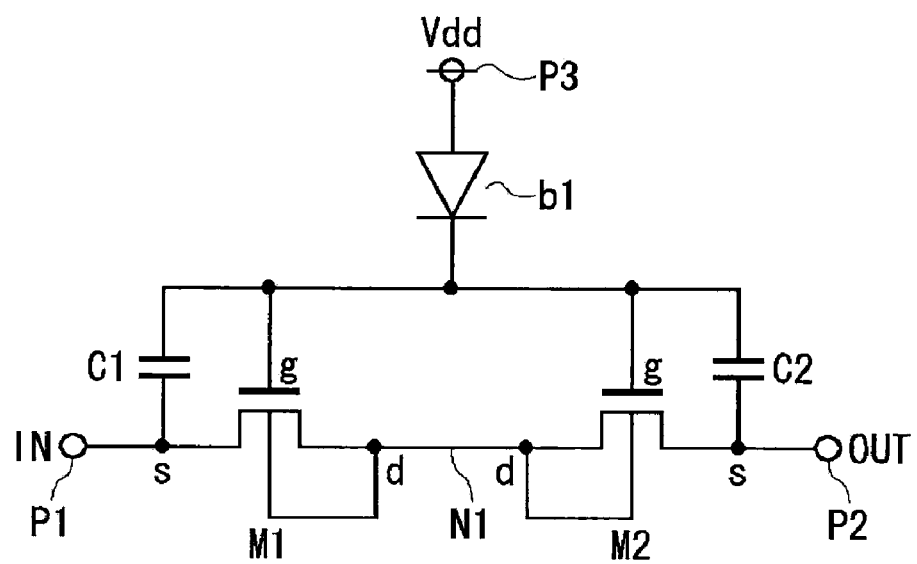
FIG. 11 is a circuit diagram which shows a configuration of an analog switch according to a first modification.

FIG. 11 is a circuit diagram which shows an analog switch 10b according to a first modification. The analog switch 10b shown in FIG. 11 further includes a second transistor M2 and a second capacitor C2, in addition to the configuration of the analog switch 10a shown in FIG. 9.

The second transistor M2 is an N-channel MOSFET, which is the same type as the first transistor M1. The second transistor M2 and the first transistor M1 are connected in series between the input terminal P1 and the output terminal P2. Furthermore, the gate of the second transistor M2 and the gate of the first transistor M1 are connected to each other so as to form a common gate. For convenience of explanation, the terminal of the second transistor M2 on the output terminal P2 side will be referred to as the "source", and the terminal thereof on the first transistor M1 side will be referred to as the "drain".

The back gate of the first transistor M1 is preferably connected to a point on the node N1 side between the first transistor M1 and the second transistor M2, i.e., a point on the drain side of the first transistor M1. The back gate of the second transistor M2 is preferably connected to a point on the node N1 side, i.e., a point on the drain side of the second transistor M2.

The second capacitor C2 is provided between the gate of the second transistor M2 and the output terminal P2. The second capacitor C2 may be provided in the form of a MIM (Metal Insulator Metal) capacitance. Also, the gate-source capacitance of the second transistor M2 may be used as the second capacitor C2. The capacitance formed between the output terminal P2 and the gate of the second transistor M2 will be referred to as the "second capacitor C2" hereafter, regardless of whether it is provided in the form of a MIM capacitance or a parasitic capacitance.

With the modification shown in FIG. 11, the body diode (not shown) of the first transistor M1 and the body diode (not shown) of the second transistor M2 are connected in opposing directions between the input terminal P1 and the output terminal P2. As a result, in the OFF state of the analog switch 10b, such an arrangement provides improved isolation between the input terminal P1 and the output terminal P2.

Figure 12:
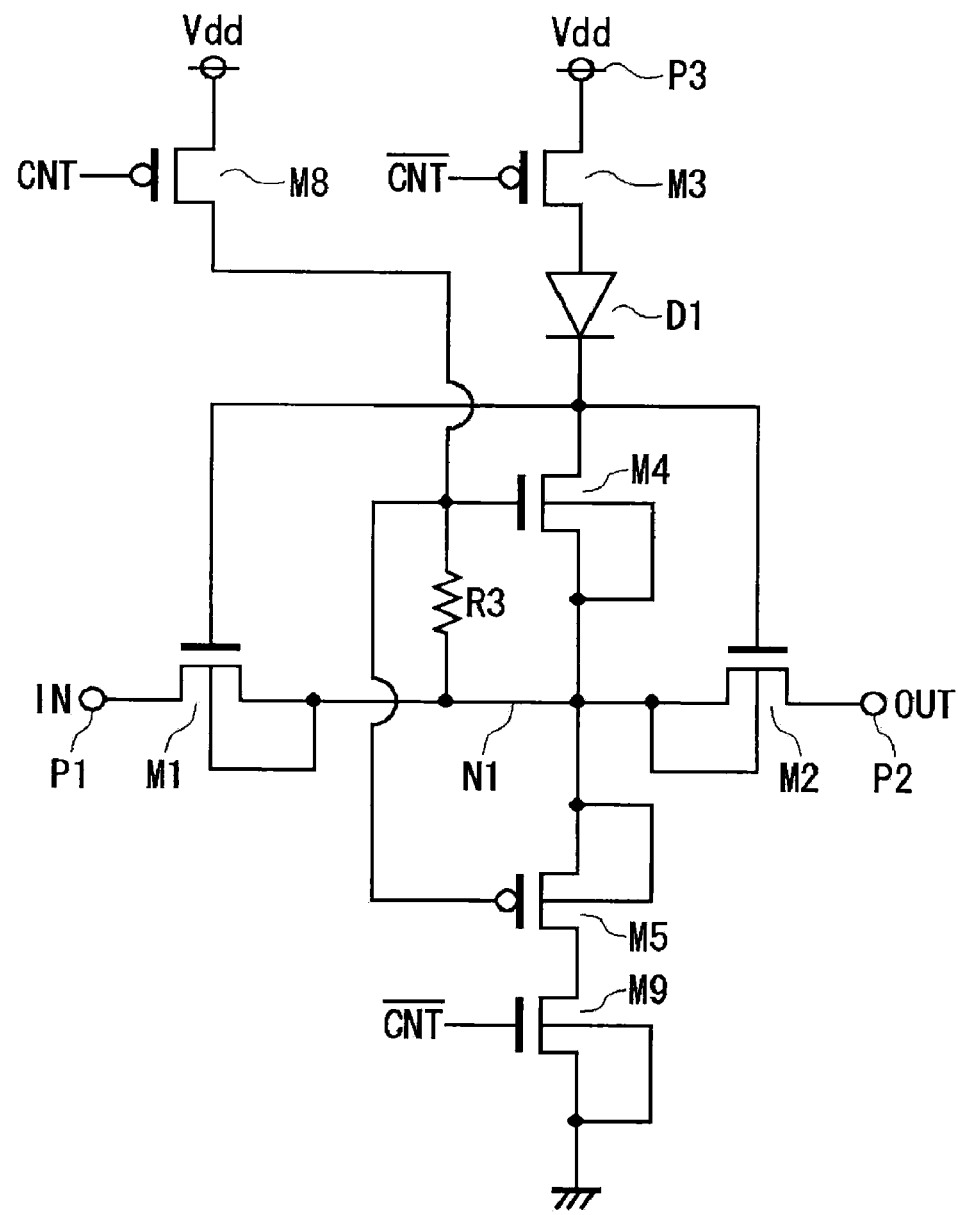
FIG. 12 is a circuit diagram which shows a configuration an analog switch according to a second modification.

FIG. 12 is a circuit diagram which shows the configuration of an analog switch 10c according to a second modification. The analog switch 10c shown in FIG. 12 includes a third transistor M3, a fourth transistor M4, a fifth transistor M5, an eighth transistor M8, and a ninth transistor M9, in addition to the configuration shown in FIG. 11. The transistors M3, M4, M5, M8, and M9 are provided in order to allow the analog switch 10c to be switched between the ON state and the OFF state. It should be noted that, in FIG. 12, the first capacitor C1 and the second capacitor C2 are not shown.

The third transistor M3 is provided between the first fixed voltage terminal P3 and the anode of the first diode D1. The gate voltage thereof is controlled according to the ON/OFF operation of the analog switch 10c. That is to say, a control signal #CNT (in this specification, the symbol "#" indicates "logical inversion"), which is switched to the low-level state when the analog switch 10c is switched to the ON state, is input to the gate of the third transistor M3.

The fourth transistor M4 is provided between the node N1 that connects the first transistor M1 and the second transistor M2 and the cathode of the first diode D1. The gate voltage of the fourth transistor M4 is controlled according to the ON/OFF operation of the analog switch 10c. A resistor R3 is provided between the gate of the fourth transistor M4 and the node N1. Furthermore, the eighth transistor M8 is provided between the power supply terminal and the gate of the fourth transistor M4. With such an arrangement, a control signal CNT is supplied to the gate of the eighth transistor M8. When the control signal CNT is switched to the high-level state, the eighth transistor M8 is switched to the OFF state. In this state, the gate of the fourth transistor M4 is pulled down by the resistor R3, and accordingly, the fourth transistor M4 is switched to the OFF state. When the control signal CNT is switched to the low-level state, the eighth transistor M8 is switched to the ON state. In this state, the gate of the fourth transistor M4 is switched to the high-level state, and accordingly, the fourth transistor M4 is switched to the ON state.

The fifth transistor M5 and the ninth transistor M9 are provided in series between the node N1 that connects the first transistor M1 and the second transistor M2 and the ground terminal. The gate voltages of the fifth transistor M5 and the ninth transistor M9 are controlled according to the control signal CNT. The gate of the fifth transistor M5 and the gate of the fourth transistor M4 are connected to each other so as to form a common gate. When the control signal CNT is switched to the high-level state, and the eighth transistor M8 is accordingly switched to the OFF state, the gate of the fifth transistor M5 is pulled up by means of the resistor R3, thereby switching the fifth transistor M5 to the OFF state. Furthermore, the control signal #CNT is input to the gate of the ninth transistor M9.

With the analog switch 10c shown in FIG. 12, when the control signal CNT is in the high-level state, the fourth transistor M4, the fifth transistor M5, and the ninth transistor M9 are in the OFF state, and the third transistor M3 is in the ON state, thereby providing a state equivalent to the state of the analog switch 10b shown in FIG. 11. In this state, the input signal IN input via the input terminal P1 is output via the output terminal P2.

When the control signal CNT is switched to the low-level state, the fifth transistor M5 and the ninth transistor M9 are switched to the ON state, and the node N1 is grounded. Furthermore, the fourth transistor M4 is switched to the ON state, and accordingly, the gates of the first transistor M1 and the second transistor M2 are grounded. As a result, at least one of the first transistor M1 and the second transistor M2 is switched to the OFF state, thereby disconnecting the connection between the input terminal P1 and the output terminal P2. Furthermore, the third transistor M3 is switched to the OFF state, thereby preventing unnecessary current flow from the first fixed voltage terminal P3 to the ground.

Such an arrangement including the fifth transistor M5, the ninth transistor M9, the fourth transistor M4, the third transistor M3, and the eighth transistor M8 has the above-described advantage. Also, several transistors may be selectively employed.

Figure 13:
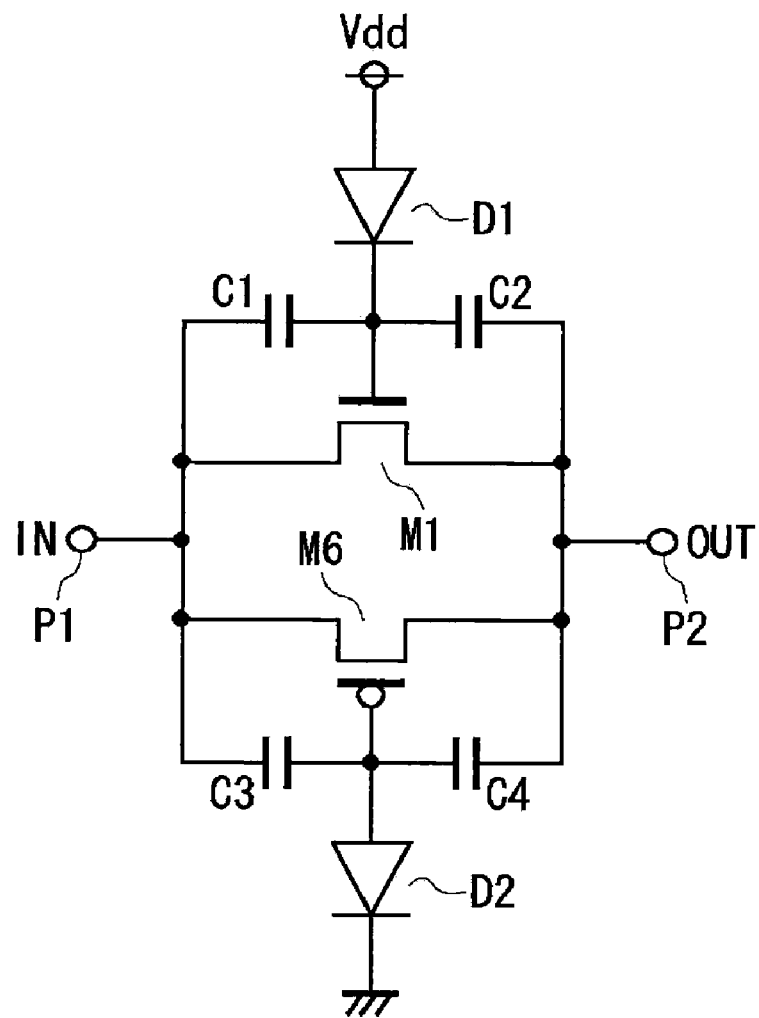
FIG. 13 is a circuit diagram which shows a configuration of an analog switch according to a third modification.

FIG. 13 is a circuit diagram which shows a configuration of an analog switch 10d according to a third modification. The analog switch 10d shown in FIG. 13 further includes a sixth transistor M6, a second diode D2, a third capacitor C3, and a fourth capacitor C4, in addition to the configuration of the analog switch 10a shown in FIG. 9.

The sixth transistor M6 is a P-channel MOSFET, and is provided between the input terminal P1 and the output terminal P2. The second diode D2 is provided between the gate of the sixth transistor M6 and the second fixed voltage terminal P4 such that the anode thereof is on the gate side of the sixth transistor M6. In the ON state of the analog switch 10d, the ground voltage is preferably applied to the second fixed voltage terminal P4.

The third capacitor C3 is provided between the gate of the second transistor M2 and the input terminal P1. The fourth capacitor C4 is provided between the gate of the second transistor M2 and the output terminal P2. The third capacitor C3 and the fourth capacitor C4 may be provided in the form of a MIM capacitance or a parasitic capacitance of the sixth transistor M6 (gate-source capacitance or gate-drain capacitance).

With the circuit shown in FIG. 13, the gate of the sixth transistor M6 is grounded via the second diode D2, thereby providing a high-impedance state. The first terminal P1 and the gate of the sixth transistor M6 are coupled by means of the third capacitor C3. Accordingly, the gate voltage of the sixth transistor M6 swings in phase with the input signal IN. As a result, the gate-source voltage of the sixth transistor M6 is maintained at a constant voltage. This suppresses fluctuation in the ON-resistance of the sixth transistor M6, thereby reducing distortion in the signal.

With the analog switch 10d shown in FIG. 13, the synthetic impedance formed between the input terminal P1 and the output terminal P2 is smaller than that shown in FIG. 9, thereby reducing signal decay.

Figure 14B:
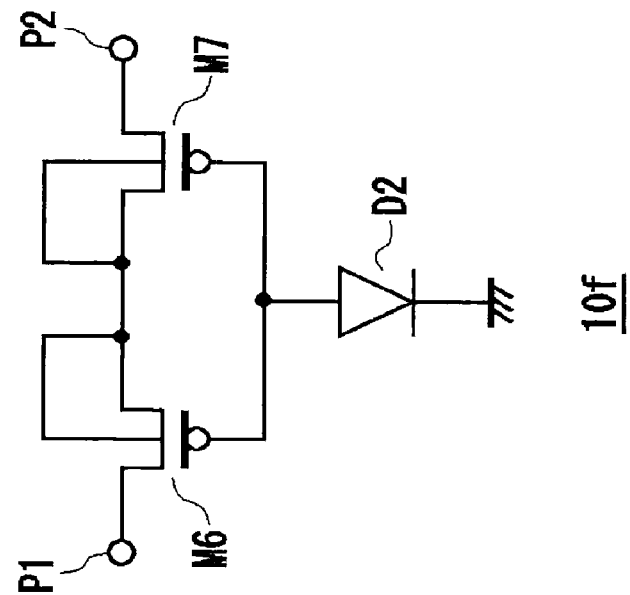
FIGS. 14A and 14B are circuit diagrams which show the configurations of analog switches according to a fourth modification.
Figure 14A:
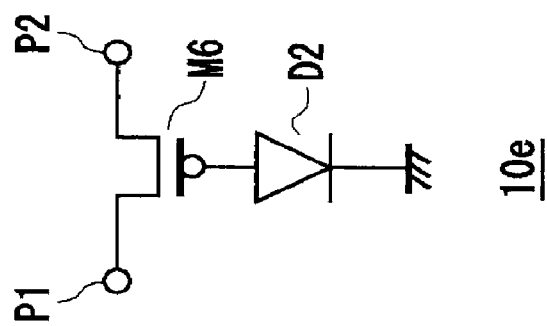

FIG. 14A and FIG. 14B are circuit diagrams which show the configurations of analog switches 10e and 10f according to fourth modification. FIG. 14A shows a modification of the circuit shown in FIG. 13, in which the fifth transistor M5, the first diode D1, the first capacitor C1, and the second capacitor C2 are omitted.

The analog switch 10f shown in FIG. 14B includes a seventh transistor M7, in addition to the configuration shown in FIG. 14A. The seventh transistor M7 is a P-channel MOSFET, and is connected in series with the sixth transistor M6 between the input terminal P1 and the output terminal P2. The gate of the seventh transistor M7 and the gate of the sixth transistor M6 are connected to each other so as to form a common gate. That is to say, it can be understood that the analog switches 10e and 10f shown in FIG. 14A and FIG. 14B have the same circuit configurations as those of the analog switches 10a and 10b shown in FIG. 9 and FIG. 11, respectively, except that the N-channel MOSFETs are replaced by the P-channel MOSFETs, and the diodes are provided in opposing directions. Accordingly, the modification described with reference to FIG. 12 can also be applied to the circuits shown in FIGS. 14A and 14B.

Figure 15:
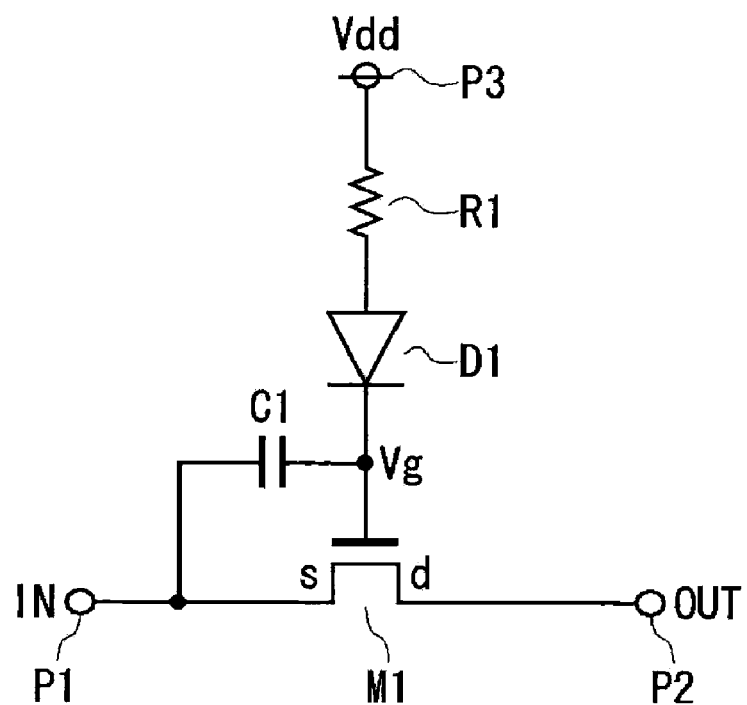
FIG. 15 is a circuit diagram which shows a configuration of an analog switch according to a fifth modification.

FIG. 15 is a circuit diagram which shows a configuration of an analog switch 10g according to a fifth modification. The analog switch 10g shown in FIG. 15 further includes a first resistor provided in series with the first diode D1 between the gate of the first transistor M1 and the first fixed voltage terminal P3. By providing the resistor R1, such an arrangement allows the impedance between the gate of the first transistor M1 and the first fixed voltage terminal P3 to be adjusted. The positions of the resistor R1 and the first diode D1 may be exchanged. Also, a resistor may be provided in series with the second diode D2 shown in FIG. 13 and FIGS. 14A and 14B.

Viewed from a different perspective, the above-described analog switches can be understood as follows. That is to say, an analog switch according to an embodiment includes: an input terminal P1 via which an analog signal IN is input; an output terminal P2 via which an analog signal OUT is output; a MOSFET which is provided between the input terminal P1 and the output terminal P2; and an impedance element which is provided between the gate of the MOSFET and the fixed voltage terminal, and which charges the gate of the MOSFET. The term "impedance element" represents a circuit device element having impedance which allows the gate voltage of the MOSFET to change without being fixed to the voltage at the fixed voltage terminal. With the embodiment, the impedance element is provided in the form of a diode or a combination of a diode and a resistor.

Figure 16B:
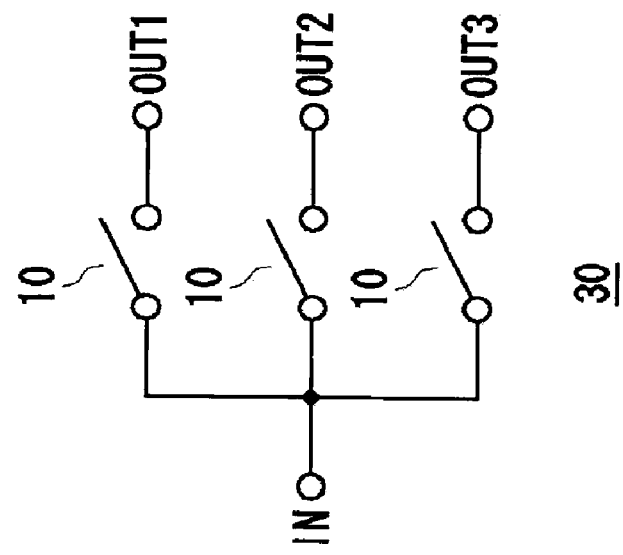
FIGS. 16A and 16B are block diagrams which show the configurations of selector circuits using the analog switches.
Figure 16A:
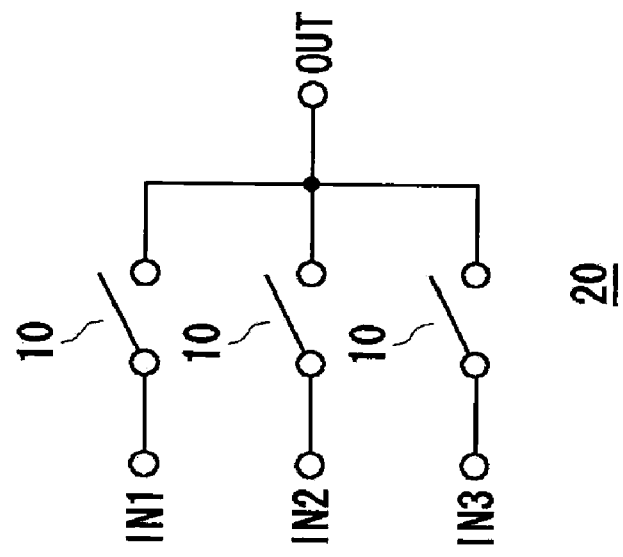

FIGS. 16A and 16B are block diagrams which show the configurations of selector circuits employing any one of the above-described analog switches 10 through 10g (which will be simply referred to as the "analog switch 10"). FIG. 16A shows a multiplexer 20, and FIG. 16B shows a demultiplexer 30. The multiplexer shown in FIG. 16A includes multiple analog switches 10. Each analog switch may be any one of the above-described circuits. The output terminals of the multiple analog switches 10 are connected to each other so as to form a common output terminal. The input terminals receive respective signals that differ from one another. The demultiplexer 30 shown in FIG. 16B includes multiple analog switches 10. Each analog switch may be any one of the above-described circuits. The input terminals of the multiple analog switches 10 are connected to each other so as to form a common input terminal. The output terminals are connected to respective circuit blocks that differ from one another. Each of the multiplexer 20 and the demultiplexer 30 has the advantage of reducing distortion in the transmitted signal.

Description has been made in the embodiment regarding an arrangement in which an analog signal is transmitted via the analog switch 10. Also, a digital signal may be transmitted via the analog switch 10. Also, a differential signal may be transmitted using two paired analog switches.

While the preferred embodiments of the present invention have been described using specific terms, such description is for illustrative purposes only, and it is to be understood that changes and variations may be made without departing from the spirit or scope of the appended claims.

The invention claimed is:

1. An analog switch comprising:
    an input terminal via which an analog switch is input;
    an output terminal via which the analog signal is output;
    a first N-channel MOSFET (Metal Oxide Semiconductor Field Effect Transistor) provided between the input terminal and the output terminal;
    a first diode provided between the gate of the first MOSFET and a first fixed voltage terminal, such that the cathode thereof is arranged on the gate side of the first MOSFET;
    a second MOSFET which is a P-channel MOSFET provided between the input terminal and the output terminal; and
    a second diode provided between the gate of the second MOSFET and a second fixed voltage terminal, such that the anode thereof is arranged on the gate side of the second MOSFET.

* * * * *